(12) United States Patent
Biedka et al.

(10) Patent No.: US 7,042,958 B2
(45) Date of Patent: May 9, 2006

(54) DIGITAL TIME ALIGNMENT IN A POLAR MODULATOR

(75) Inventors: Thomas E. Biedka, San Jose, CA (US); Wayne S. Lee, San Mateo, CA (US); Gary L. Do, San Jose, CA (US)

(73) Assignee: Tropian, Inc., Cupertino, CA (US)

( * ) Notice: Subject to any disclaimer, the term of this patent is extended or adjusted under 35 U.S.C. 154(b) by 0 days.

(21) Appl. No.: 10/454,906

(22) Filed: Jun. 4, 2003

(65) Prior Publication Data

US 2004/0247041 A1    Dec. 9, 2004

(51) Int. Cl.
*H04K 1/02* (2006.01)
(52) U.S. Cl. ........................ 375/297; 375/395
(58) Field of Classification Search ........ 375/295–315; 332/145
See application file for complete search history.

(56) References Cited

U.S. PATENT DOCUMENTS

| 4,811,263 | A  | * | 3/1989  | Hedley et al. ............. 708/316 |
| 2002/0013133 | A1 |   | 1/2002  | Lam ........................... 455/137 |
| 2002/0141510 | A1 | * | 10/2002 | Sridharan et al. ........... 375/300 |
| 2002/0193085 | A1 | * | 12/2002 | Mathe et al. ................ 455/126 |
| 2002/0196864 | A1 | * | 12/2002 | Booth et al. ................ 375/296 |
| 2003/0012289 | A1 | * | 1/2003  | Lindoff ........................ 375/262 |
| 2003/0215026 | A1 | * | 11/2003 | Hietala ........................ 375/297 |
| 2004/0046607 | A1 | * | 3/2004  | Grange ........................ 330/10 |
| 2004/0240585 | A1 | * | 12/2004 | Bishop et al. ............... 375/297 |

FOREIGN PATENT DOCUMENTS

| DE | 1056248 | * 11/2000 |
| EP | 1 056 248 | 5/1999 |

OTHER PUBLICATIONS

Su et al., "An IC for Linearizing RF Power Amplifiers using Envelope Elimination and Restoration", IEEE Journal of Solid-State Circuits, Dec. 1998, vol. 33, No. 12.*
Liu et al., "Condsideration on Applying OFDM in a highly Efficient Power Amplifier", IEEE Transactions on Circuits and Systems II-II: Analog and Digital Signal Processing, vol. 46, 1999, pp. 1329-1336.*
International Search Report dated Sep. 21, 2004, Application No. PCT/US04/14218.

* cited by examiner

*Primary Examiner*—Kenneth Vanderpuye
*Assistant Examiner*—Jason M. Perilla

(57) ABSTRACT

Methods of and apparatus for digitally controlling, with sub-sample resolution, the relative timing of the magnitude and phase paths in a polar modulator. The timing resolution is limited by the dynamic range of the system as opposed to the sample rate. The methods and apparatus of the invention use a digital filter to approximate a sub-sample time delay. Various techniques for approximating a sub-sample time delay using digital signal processing may be used to achieve the approximation. Ideally, the filter will have an all-pass magnitude response and a linear phase response. In practice, the magnitude may be low-pass and the phase may not be perfectly linear. Such deviation from the ideal response will introduce some distortion. However, this distortion may be acceptably small depending on the particular signal being processed.

11 Claims, 2 Drawing Sheets

DIGITAL TIME ALIGNMENT IN A POLAR MODULATOR

FIELD OF THE INVENTION

The present invention relates generally to power modulators. More specifically, the present invention relates to time alignment between the amplitude and phase paths of a polar modulator.

BACKGROUND OF THE INVENTION

In a polar modulator, the amplitude modulation and phase modulation are processed separately before being combined to create the desired signal. The processing of the magnitude and phase modulations are different, which can introduce a relative time offset between the magnitude and phase signal components. If this relative time offset is not corrected, the desired signal will not be accurately generated, and distortion will result. Typically this distortion will result in an increase in out-of-band signal energy.

One approach to solving this problem is to process the signal with a sample rate that is fast enough so that the required time offset correction can be achieved with a simple digital register. This may be a reasonable approach if the signal bandwidth is low. However, for high bandwidth signals, such as CDMA and WCDMA, the relative magnitude/phase timing may need to be accurate to within one nanosecond or less. Such timing resolution would require a sample rate on the order of 1 GHz, which is not practical.

Another approach is to use analog delay elements. These delay elements would be placed in the magnitude and/or phase paths after D/A conversion. Unfortunately, this approach has several drawbacks, including: (1) the delay may vary with time, with temperature, and from part to part; (2) the delay provided by the analog delay elements may need to be calibrated, which is a drawback in a low-cost manufacturing environment; and (3) the analog delay elements may be difficult to integrate into an integrated circuit, which increases the number of required components.

SUMMARY OF THE INVENTION

Methods of and apparatus for digitally controlling, with sub-sample resolution, the relative timing of the magnitude and phase paths in a polar modulator are disclosed. Being completely digital, there is no manipulation necessary to timing of system signals. The timing resolution is limited by the dynamic range of the system as opposed to the sample rate. A digital filter is employed to approximate a sub-sample time delay. Various techniques for approximating a sub-sample time delay using digital signal processing may be used for this purpose. The filter will ideally have an all-pass magnitude response and a linear phase response. In practice, the magnitude may be low-pass and the phase may not be perfectly linear. Such deviation from the ideal response will introduce some distortion. However, this distortion may be acceptably small depending on the particular signal being processed. Thus, fine-resolution time alignment among signals can be achieved without any explicit delay manipulation of clock or data signals. Lower development and production costs are an immediate benefit.

Further aspects of the invention are described and claimed below, and a further understanding of the nature and advantages of the inventions may be realized by reference to the remaining portions of the specification and the attached drawings.

DETAILED DESCRIPTION OF INVENTION

Figure 1:
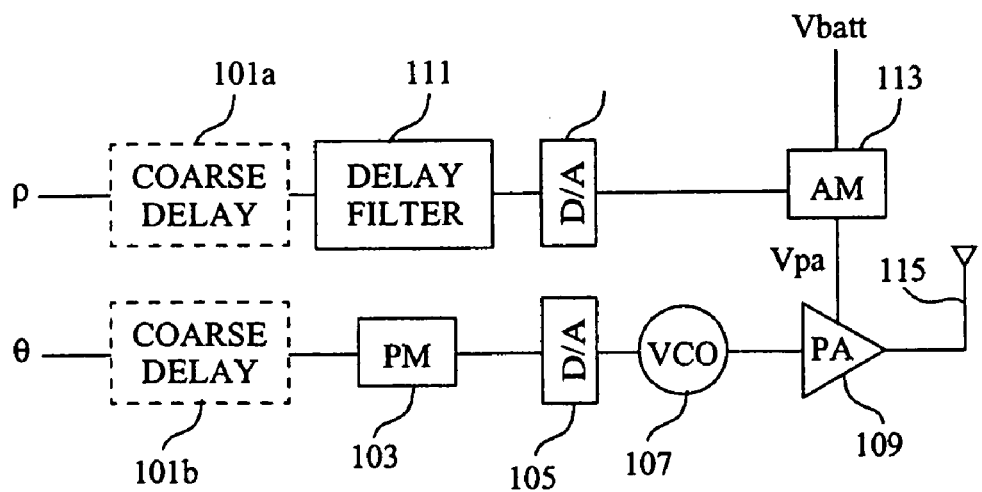
FIG. 1 is a block diagram of a portion of a polar modulator.

Referring now to FIG. 1, there is shown of a portion of a polar modulator in accordance with an embodiment of the present invention. A signal to be transmitted is represented in polar form as magnitude information ρ and phase information θ. Optionally, one of the magnitude path and the phase path may be delayed relative to the other by one or more sample periods in delay blocks 101a, 101b to achieve coarse time alignment.

Considering first the phase path, phase modulation is performed by a digital phase modulator 103. Digital to analog conversion (105) then follows, and the resulting analog signal is applied to a voltage controlled oscillator (VCO) 107. An output signal of the VCO is applied to an RF input of an RF power amplifier 109. Preferably, the RF amplifier is operated in compression, or switch mode.

Considering next the magnitude path, the magnitude information is applied to a delay filter 111 for fine, sub-sample-time delay adjustment, as described in greater detail hereinafter. Digital to analog conversion (110) then follows, and the resulting signal is applied to an amplitude modulator, or power driver 113. The amplitude modulator receives as an input a supply voltage Vbatt and produces a voltage Vpa that is applied to a supply terminal of the power amplifier 109. Responsive to the output signal of the VCO and to the voltage Vpa, the power amplifier produces the desired output signal, which is applied to an antenna 115, for example, for transmission. It should be mentioned here that, although the delay filter is shown in FIG. 1 as being in the magnitude path, it could equally well be located in the phase path.

As illustrated in the foregoing FIG. 1, the relative timing of the magnitude and phase can be controlled by delaying one path relative to the other. Further details of the delay filter 111 will now be considered. Without loss of generality, consider delaying the magnitude ρ by τ, where τ is some fraction of a sample interval. Stated mathematically, the magnitude ρ is known only at the discrete time instants kT, where k is an integer and T is the sampling period. An accurate estimate is to be found of the magnitude at some time instant kT+ΔT where 0<Δ<1. For the remainder of this disclosure, the magnitude ρ at discrete time instant kT will be denoted by ρ(k).

One approach is to use linear interpolation. Linear interpolation can be viewed as a non-recursive filtering operation with two filter coefficients. The filter output will provide an estimate of the magnitude at time instant $kT+\Delta T$. If the filter input is denoted by x and the filter output by y, linear interpolation is defined as $$y(k)=x(k)+\Delta[x(k+1)-x(k)]$$

Linear interpolation has been described here so that only one multiplication is needed, which is important in a practical implementation. Note that the resolution of the delay is only limited by the number of bits used to represent the delay.

Another approach is to use a first-order all-pass digital filter. This filter is of the infinite-impulse-response (IIR) type, and is defined by the recursion $$y(k)=c[x(k)-y(k-1)]+x(k-1)$$

where $$c = \frac{1-\Delta}{1+\Delta}$$

Still another approach is to use a finite-impulse-response (FIR) filter designed to have nearly linear phase and a nearly flat passband. Such a filter may be designed, for example, according to a minimum mean-square error (MMSE) criterion.

The effectiveness of digital sub-sample delay compensation will now be demonstrated through simulation. A simulation procedure was used to generate a PAM signal with 16 samples per symbol, calculate the magnitude and phase, time shift the magnitude by one sample, and decimate the magnitude and phase by two. The magnitude and phase then have 8 samples per symbol, and the relative magnitude-phase timing offset is exactly ½ sample. Without loss of generality, an EDGE signal was for this demonstration.

Figure 2:
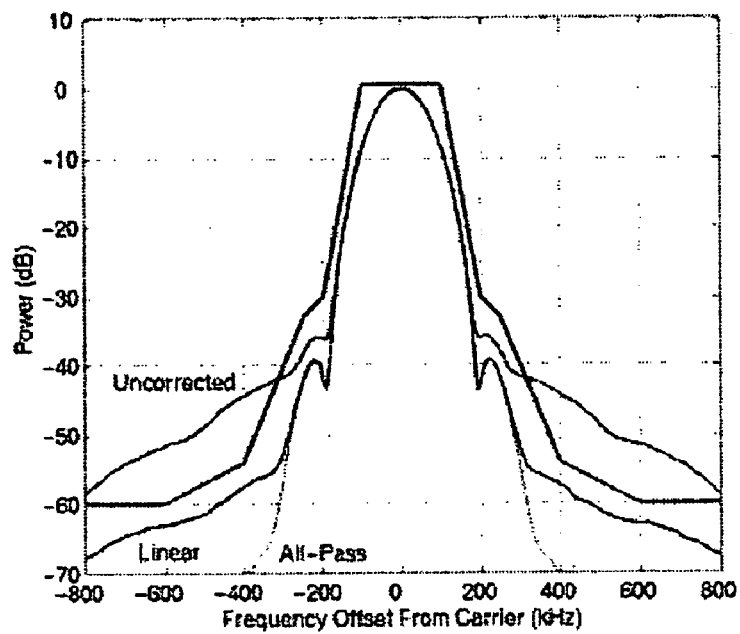
FIG. 2 is a plot showing, in relation to EDGE (Enhanced Data GSM (Global System for Mobile Communications) Environment) transmit mask power spectral density (PSD) of various signals including a signal generated from time-misaligned magnitude and phase components, a signal generated from magnitude and phase components time aligned using a linear digital filter, and a signal generated from magnitude and phase components time aligned using an all-pass filter.

The effect of the ½ sample timing offset on the PSD of the reconstructed EDGE signal is shown in FIG. 2, where it is seen that the magnitude-phase time offset causes the signal to violate the EDGE spectral mask (from 3GPP TS 45.005 v5.1.0 for DCS 1800 mobile station with output power ≦30 dBm). If the magnitude-phase time offset is corrected with linear interpolation, it can be seen that the corrected signal meets the spectral mask. However the margin to the mask at 400 kHz offset is only about 3 dB. If a first-order all-pass filter is used to compensate for the time-offset, the resulting margin to the mask at 400 kHz offset is nearly 17 dB. This shows that the all-pass filter is better able to compensate for the magnitude-phase time offset. The relative performance of linear interpolation and all-pass filtering will depend on the sample rate. If the signal is processed at a sufficiently high sample rate, there will be very little difference between linear interpolation and all-pass filtering.

Figure 3:
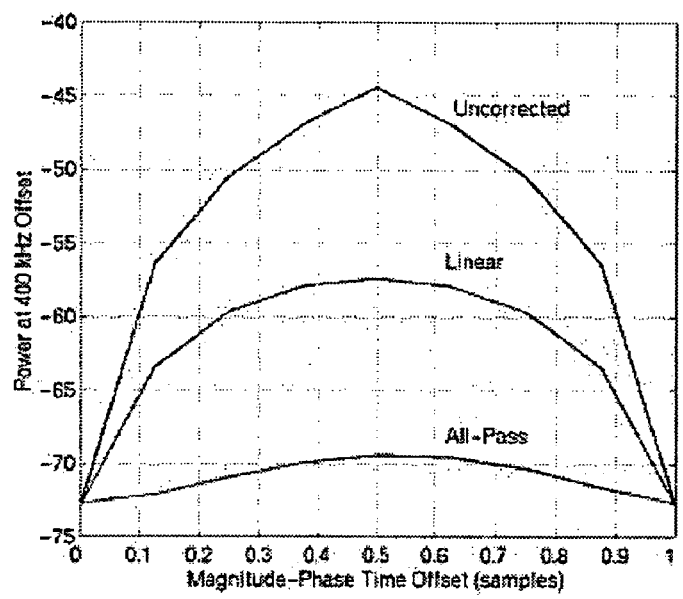
FIG. 3 is a plot corresponding to that of FIG. 1 showing power at 400 kHz offset versus magnitude-phase time offset for the various signals.

To determine the ability of linear interpolation and all-pass filtering to correct a range of time-offset values, the following simulation was performed. An EDGE signal was generated with 64 samples per symbol, and the following steps were performed: calculate the magnitude and phase, time shift the magnitude by zero to eight samples, then decimate the magnitude and phase by 8. The magnitude and phase then have 8 samples per symbol, and the relative magnitude-phase timing offset varies from 0 to 1 sample in 1/8 sample steps. FIG. 3 shows the relative power of the PSD at a 400 kHz offset for the uncorrected signal and corrected signals as a function of the time offset. It is clear that in all cases a time offset of ½ sample is the worst case.

The all-pass filter is able to compensate for a broad range of time offsets with little variation in performance.

Figure 4:
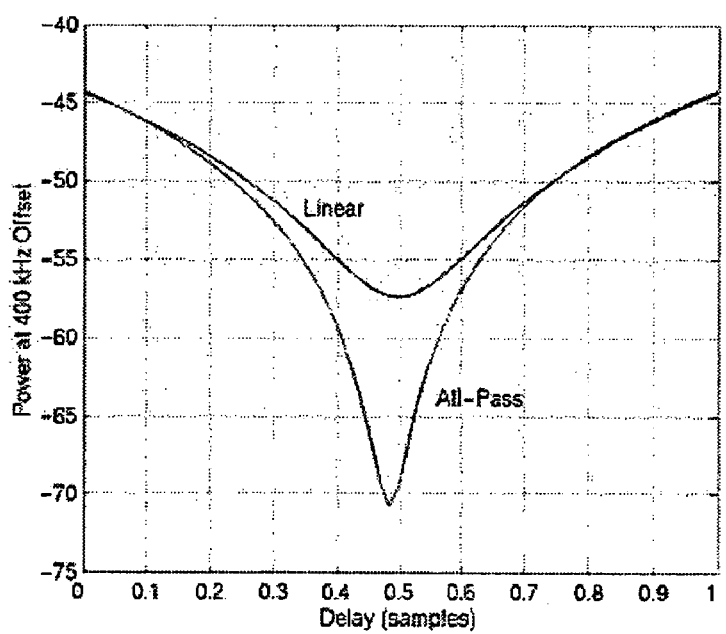
FIG. 4 is a plot comparing power at 400 kHz offset versus delay for linear and all-pass filters, respectively.

A final issue is the required resolution of the delay parameter for linear interpolation and all-pass filtering. To study this the following simulation was performed. An EDGE signal was generated with 8 samples per symbol, and ½ sample time-offset between magnitude and phase, and the time delay parameter of a linear interpolator and an all-pass filter was varied. The results of this experiment are shown in FIG. 4. At a delay value of 0.5 samples, nominal time-alignment is achieved. For the linear filter, power at a 400 kHz offset is more than 55 dB down. For the all-pass filter, power is more than 70 dB down.

In practice, the parameters of the delay filter may be calibrated at design time and set so as to achieve the desired PSD characteristics. For different designs, the parameters of the delay filter may be different.

It will be appreciated from the foregoing description that both linear interpolation and a first-order all-pass filter can provide an effective means for controlling magnitude-phase timing to sub-sample accuracy. The all-pass filter provides superior performance at the cost of increased implementation complexity. Further improvements in performance can be achieved by using an FIR filter with more than two taps to approximate the desired delay. Such a filter could be designed according to an MMSE criterion. All of these simulations presented have been fully validated by hardware implementation. This proves that sub-sample-time signal delay shifting can be fully implemented using strictly digital techniques, eliminating any need for delay manipulation of data or clock signals in the design. Or, equivalently, eliminating the tradeoff of being forced to accept time alignment resolution set by system clock frequencies (sample times).

Whereas the above is a complete description of the preferred embodiments of the invention, various alternatives, modifications, and equivalents may be used. Therefore, the above description should not be taken as limiting the scope of the invention as it is defined by the appended claims.

What is claimed is:

1. A method of achieving time alignment between an amplitude path signal and a phase path signal in a modulator having separate amplitude and phase paths, comprising:
   providing a digital filter within one of the amplitude and phase paths;
   providing a plurality of indications of a first signal to the digital filter at a corresponding plurality of times kT, where k is an integer and T is a sample period;
   with the digital filter, producing an alternative signal at a particular first time selected from the plurality of times kT; and
   outputting from the digital filter the alternative signal, the alternative signal representing a relative delay between the amplitude and phase path signals that corresponds to a substantial time alignment of the amplitude and phase path signals;
   wherein the alternative signal is produced based upon the plurality of indications of the first signal at times kT.

2. The method of claim 1 wherein the digital filter comprises a linear filter, an IIR filter, an FIR filter, or an all-pass filter.

3. The method of claim 1 wherein the digital filter comprises an IIR filter having more than two coefficients.

4. The method of claim 1 wherein said relative delay is less than or equal to one sample interval associated with said modulator.

5. The method of claim 1 wherein said digital filter comprises an FIR filter having two or more coefficients.

6. The method of claim 1 wherein no time delays are performed on either a system clock controlling the modulator or on signals provided by either of said amplitude and phase paths.

7. An electrical circuit, comprising:
an amplitude path having circuitry for amplitude modulating an input signal to produce an amplitude-modulated signal;
a phase path having circuitry for phase modulating the input signal to produce a phase-modulated signal; and
means for creating an estimated signal in one of the phase path and the amplitude path with a digital filter by digitally filtering a plurality of signal values at discrete points in time kT, where k is an integer and T is an interval between the discrete points in time, and producing the estimated signal at a particular time $kT+\Delta T$ from the plurality of times kT to correct for timing misalignments between said amplitude-modulated and phase-modulated signals, where $\Delta T$ is an offset in time from a particular time kT.

8. A method of achieving time alignment between an amplitude path signal and a phase path signal in a modulator having separate amplitude and phase paths, comprising:
providing a digital filter within one of the amplitude path and the phase path;
providing a plurality of values related to a first signal to the digital filter at a plurality of discrete points in time kT, where k is an integer and T is a time period;
constructing, with the plurality of values of the first signal, a value of a second signal at a particular time $kT+\Delta T$ from the plurality of times kT, where $\Delta T$ is an offset in time from a particular time kT;
outputting, from the digital filter, the second signal;
wherein the second signal substantially time aligns a relative delay between the amplitude and phase paths.

9. A transmitter comprising:
an amplitude path for carrying an amplitude path signal;
a separate phase path for carrying a phase path signal;
an amplifier, responsive to separate amplitude and phase signals, for producing a communications signal;
within one of the amplitude path and the phase path, a means for digitally constructing an output signal;
means for providing a plurality of values related to a first signal to the means for digitally constructing an output signal a plurality of discrete points in time kT, where k is an integer and T is a time period;
wherein the means for digitally constructing the output signal is operable to construct an output value corresponding to a second signal, the output value dependent upon the plurality of values related to the first signal and an offset time $\Delta T$,
wherein the second signal corresponds to an estimate of the first signal at a particular time $kT+\Delta T$ from the plurality of times kT, $\Delta T$ is an offset in time, and the second signal substantially time aligns a relative delay between the amplitude and phase paths.

10. A transmitter comprising:
an amplitude path for carrying an amplitude path signal;
a separate phase path for carrying a phase path signal;
an amplifier, responsive to separate amplitude and phase signals, for producing a communications signal;
within one of the amplitude path and the phase path, a digital filter with an output operable to receive a first signal, the digital filter operable to construct an output signal;
the output signal dependent upon:
a plurality of values related to the first signal at particular discrete points in time kT, where k is an integer and T is a time period; and
a time offset $\Delta T$;
wherein the output signal corresponds to an estimate of the first signal at a particular time $kT+\Delta T$ from the plurality of times kT;
wherein a relative time delay between the output signal and a second signal on the path other than the output signal is less than a mismatch between the second signal and the first signal.

11. An electrical circuit comprising:
an amplitude path operable to carry an amplitude path signal;
a separate phase path operable to carry a phase path signal;
within one of the amplitude path and the phase path, a digital filter with an output operable to receive a first signal, the digital filter operable to construct a modified first signal;
the modified first signal dependent upon:
a plurality of values related to the first signal at particular discrete points in time kT, where k is an integer and T is a time period; and
a time offset;
wherein the modified first signal corresponds to an estimate of the first signal at a particular time offset from a particular time kT from the plurality of times kT;
wherein a relative time delay between the output signal and a second signal on the path other than the output signal is less than a mismatch between the second signal and the first signal.

* * * * *